United States Patent [19]

Nguyen et al.

[11] Patent Number: 5,493,297

[45] Date of Patent: Feb. 20, 1996

[54] QUANTIZATION NOISE REDUCTION IN OVERSAMPLED ANALOG-TO-DIGITAL SIGNAL CONVERSION

[75] Inventors: Truong-Thao Nguyen; Martin F. Vetterli, both of New York, N.Y.

[73] Assignee: The Trustees of Columbia University, New York, N.Y.

[21] Appl. No.: 366,025

[22] Filed: Dec. 29, 1994

Related U.S. Application Data

[63] Continuation of Ser. No. 149,124, Nov. 4, 1993, abandoned, which is a continuation of Ser. No. 723,231, Jun. 28, 1991, abandoned.

[51] Int. Cl.⁶ .................................................. H03M 1/06
[52] U.S. Cl. .................... 341/118; 341/143; 364/413.13
[58] Field of Search ................................. 341/118, 120, 341/131, 143, 155; 364/413.13, 413.15, 413.16, 413.19

[56] References Cited

U.S. PATENT DOCUMENTS

| | | | |
|---|---|---|---|
| 4,135,247 | 1/1979 | Gordon et al. | 364/413.19 |
| 4,222,110 | 9/1980 | Judell . | |
| 4,562,540 | 12/1985 | Devaney | 364/413.19 |
| 4,754,260 | 6/1988 | Nelson et al. . | |
| 4,984,160 | 1/1991 | Saint Felix et al. | 364/413.19 |

OTHER PUBLICATIONS

"Decimation for Sigma Delta Modulation" by James C. Candy, *IEEE Transactions on Communications*, vol. COM-34, No. 1, Jan. 1986.

"Improving A/D Conversion by Digital Signal Processing–Novel Solutions for Known Problems and New Problems" by Ulrich Heute, *Frequenz* 42 (1988) 2/3, pp. 93–101.

"Digitally Corrected Multi–Bit Data Converters" by Cataltepe et al., ISCAS '89, pp. 647–650.

"New Results With Oversampled Converters" by Harris et al., 23ACSSC–Dec./1989, pp. 844–848.

"Image Restoration by the Method of Convex Projections: Part 1–Theory" by Youla et al., IEEE Transactions On Medical Imaging, vol. MI–1, No. 2, Oct. 1982, pp. 81–94.

*Primary Examiner*—Marc S. Hoff
*Attorney, Agent, or Firm*—Brumbaugh, Graves, Donohue & Raymond

[57] ABSTRACT

Quantization noise in oversampled digital data can be reduced by processing including alternate steps of lowpass filtering and so-called code projection, in cases where the set of discrete-time signals corresponding to quantized-signal data is a convex set. Corresponding specific methods are disclosed for simple analog-to-digital conversion, "dithered" analog-to-digital conversion, and first- and second-order single-path $\Sigma\Delta$-conversion. For example, in the case of simple analog-to-digital conversion, code projection involves replacing sample values by quantization-threshold values in those cases where, after filtering, a sample value lies in a different quantization interval as compared with the corresponding value of quantized-signal data.

24 Claims, 6 Drawing Sheets

QUANTIZATION NOISE REDUCTION IN OVERSAMPLED ANALOG-TO-DIGITAL SIGNAL CONVERSION

This application is a continuation of application Ser. No. 08/149,124, filed on Nov. 4, 1993, now abandoned, which was a continuation of application Ser. No. 07/723,231, filed on Jun. 28, 1991, now abandoned.

BACKGROUND OF THE INVENTION

This invention relates to the reduction of quantization noise in digital signals produced by oversampling an analog signal.

In numerous fields of application, e.g., sound recording and reproduction, seismic exploration, medical imaging, and scientific data acquisition, it is often desirable to represent analog signals by digital approximations to sampled values taken at regular time intervals; this may be for the sake of convenience of processing or of storage, for example. In the favorable case where the signal is bandlimited, it is known from the Shannon theorem that no information is lost due to sampling when a signal is sampled at a rate more than twice the frequency of its highest-frequency component (Nyquist sampling rate.) On the other hand, quantizing the samples inevitably results in distortion., The quantized signal may then be regarded as the sum of the original signal and a "quantization noise."

In its simplest form, an analog-to-digital converter may involve sampling a signal without regard to previously obtained samples. Of interest also is the addition of a "dither signal" before sampling, all whose component frequencies lie outside the signal band. Alternatively, in the interest of reduced quantization noise, more sophisticated converters may use feedback as in so-called $\Sigma\Delta$-converters.

The following represents a selection from the literature concerned with quantization noise:

U.S. Pat. No. 4,222,110, issued Sep. 9, 1980 to N. H. K. Judell discloses coupling of an integrating analog-to-digital converter to a digital filter to achieve a reduction in digitization noise and aliasing.

J. C. Candy, "Decimation for Sigma Delta Modulation", *IEEE Transactions on Communications*, Vol COM-34 (1986), pp. 72–76 discloses transformation of a digital representation of an oversampled analog signal, taking short words at a high sampling rate and producing longer words at a lower rate. In the process, signal-to-noise ratio remains essentially unchanged.

U.S. Pat. No. 4,754,260, issued Jun. 28, 1988 to R. G. Nelson et al. discloses an analog-to-digital converter which includes a low-pass filter for phase differences between a reference signal and a signal modulated by an analog signal of interest. The resulting signal, taken as representative of phase error in a frequency band of interest, is used to produce a corrective feedback signal.

U. Heute, "Improving A/D Conversion by Digital Signal Processing—Novel Solutions to Known Problems and New Problems," *Frequenz*, Vol. 42 (1988), pp. 93–101 discloses oversampling analog-to-digital converters in which a linear predictor scheme is used to predict a signal sample from a linear combination of a number of preceding samples.

T. Cataltepe et al., "Digitally Corrected multi-bit $\Sigma\Delta$ Data Converters", *Proceedings, IEEE International Symposium on Circuits and Systems*, Vol. 1 (1989), pp. 647–650 discloses analog-to-digital converters in which digital correction schemes are used to compensate for nonlinearities in the digital-to-analog conversion of a feedback signal.

F. Harris et al., "New Results with Oversampled Converters", Conference Record, Twenty-Third Annual Asilomar Conference on Signalling Systems and Computers, *Asilomar Conference on Circuits, Systems, and Computers*, Vol. 2, Maple Press, 1989, pp. 844–848 discloses a two-step analog-to-digital converter in which, before digitization, an analog input signal is first converted to an analog quantized form.

In classical Nyquist-rate analog-to-digital conversion, the power of quantization noise is quadratically related to the quantizing interval and, if the quantizing subdivision is fine enough, the noise signal has a uniform distribution of amplitude ("white noise") in the signal band. In the case of oversampling, i.e., sampling a bandlimited signal at a rate higher than the Nyquist rate, the noise power spectrum can spread out of the signal band, so that oversampling can result in reduced noise in the signal band. In simple analog-to-digital conversion, if the quantization error signal is uncorrelated with the input signal, the error-signal power (or mean-square error, MSE) is reduced by a factor equal to the oversampling rate, $R=f_s/2f_m$. If the quantizer is an n-th order single-path $\Sigma\Delta$-converter, the reduction is proportional to $R^{2n+1}$. The present invention is motivated by the desire to further reduce quantization noise in analog-to-digital conversion methods involving oversampling.

SUMMARY OF THE INVENTION

Preferred methods and systems reduce quantization noise in digital data obtained by oversampling an analog signal. A preferred method involves projection transformations derived from lowpass filtering and from quantization, in cases where quantization is such that the set of discrete signals corresponding to a quantized representation is a convex set.

DETAILED DESCRIPTION OF PREFERRED EMBODIMENTS

Figure 1:
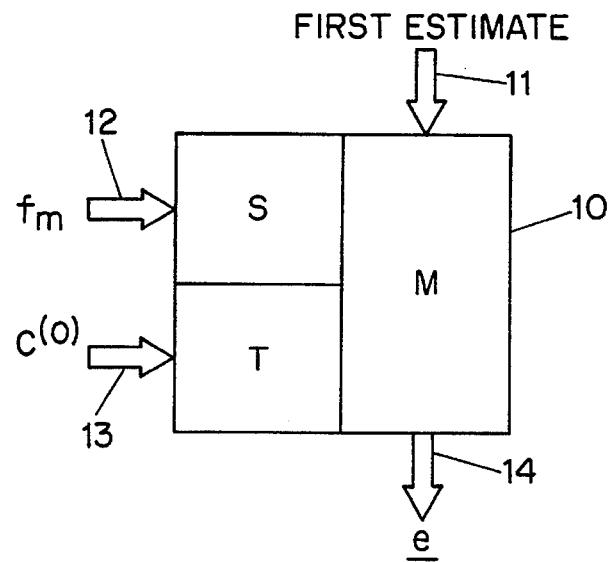
FIG. 1 is a diagram of a computer system including a preferred embodiment of the invention.

Preferred embodiments of the invention include methods and systems, e.g., as illustrated in FIG. 1. A preferred computer system 10 includes memory means M and computing means S and T for performing respective preferred transformations described below; computing means may be realized in hardware, firmware, or software. Further shown in FIG. 1 are input means 11 for a first estimate, input means 12 for a bandlimit frequency $f_m$, input means 13 for quantized-signal input data $\underline{C}^{(0)}$, and output means 14 for reduced-noise output data $\underline{e}$.

In the following description with reference to FIG. 2 through 12, vector notation will be used, with subscripts of vector components representing a time index corresponding to instances of sampling at equal time intervals.

Figure 2:
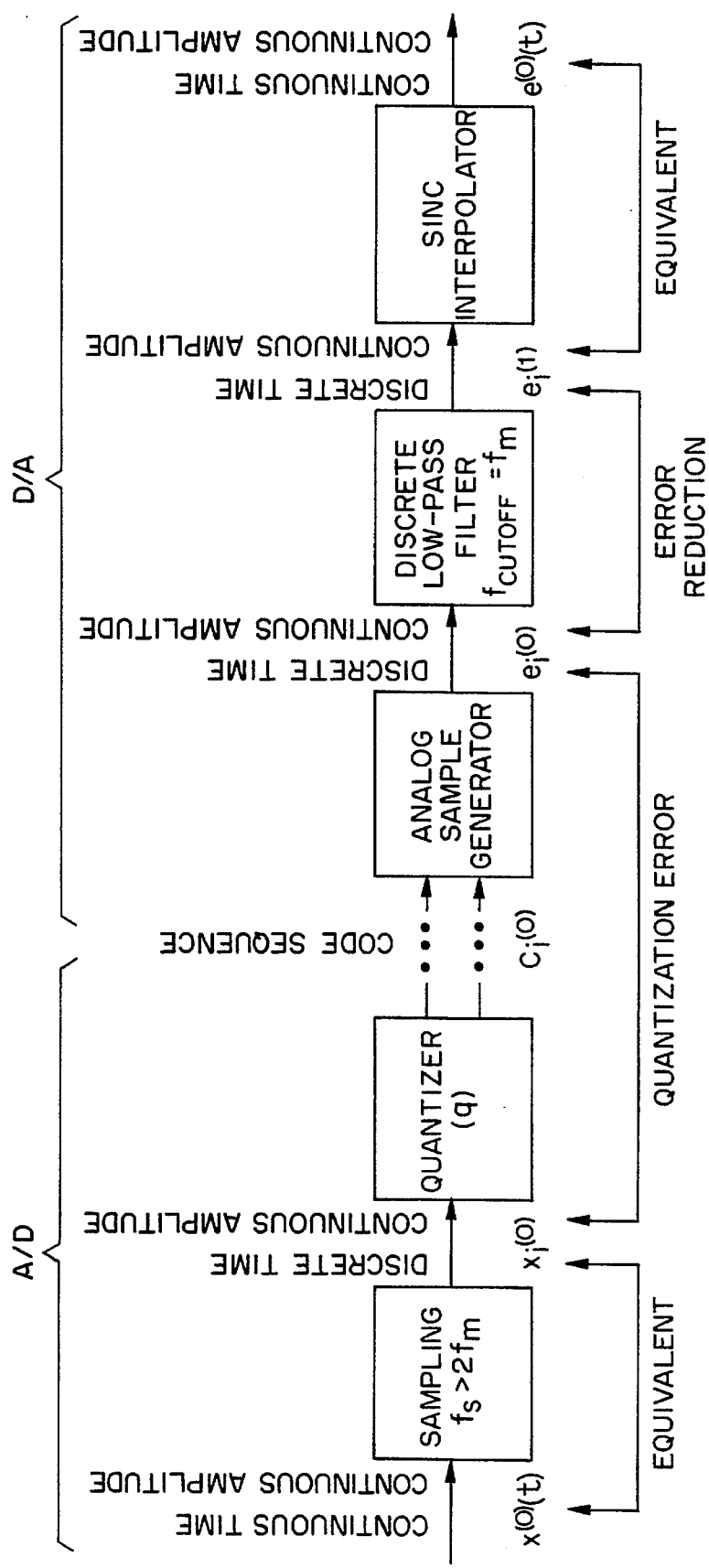
FIG. 2 is a block diagram illustrating oversampled analog-to-digital conversion followed by digital-to-analog readout.
Figure 4:
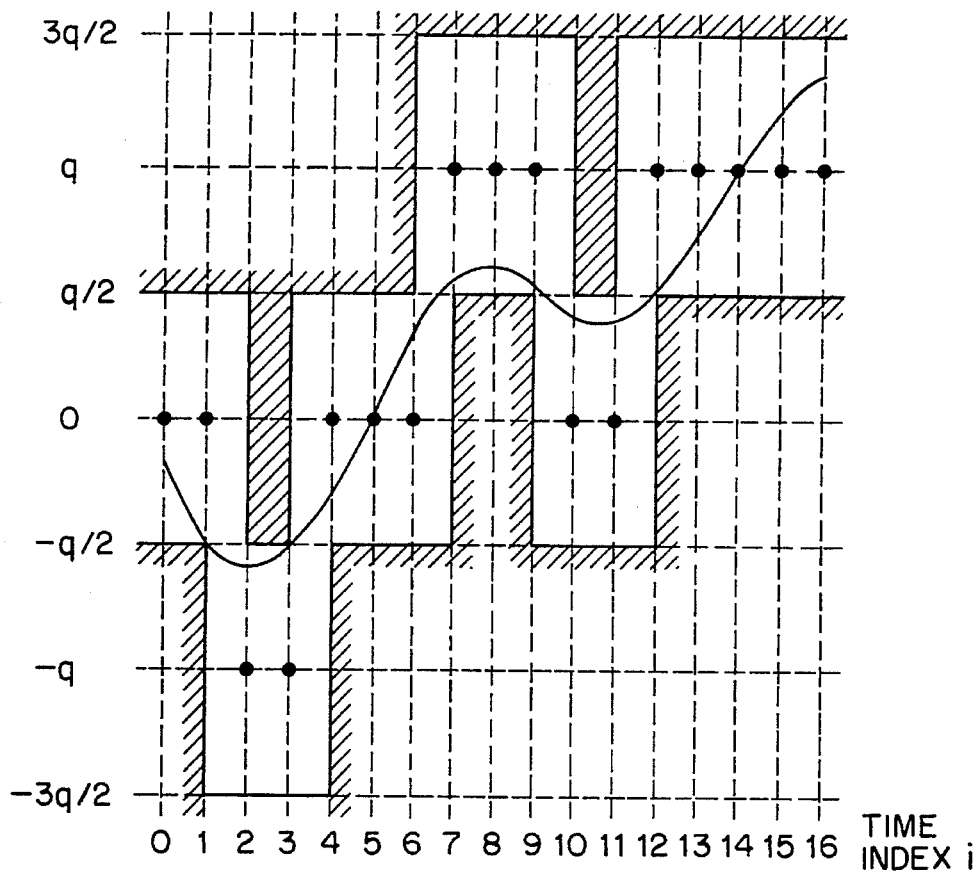
FIG. 4 is a graphic time-domain representation of a signal set of interest in connection with the example of FIG. 3.

FIG. 2 graphically illustrates successive steps as may be identified in conventional oversampled analog-to-digital and digital-to-analog conversion. An input signal $x(t)=x^{(0)}(t)$, continuous in time and continuous in amplitude, and band-limited to a maximum frequency $f_m$, is sampled at a sampling rate $f_s$ greater than $2f_m$ (the Nyquist rate.) The resulting discrete-time, continuous-amplitude signal $\underline{x}^{(0)}=\{x_i^{(0)}\}$ is equivalent to $x^{(0)}(t)$. Quantization of $\underline{x}^{(0)}$ produces a (digital) code sequence $\underline{C}^{(0)}=\{C_i^{(0)}\}$ which is discrete in time as well as discrete (or quantized) in amplitude. Subsequent digital-to-analog conversion, i.e., production of a continuous-time, continuous-amplitude signal $e^{(0)}(t)$ from $\underline{C}^{(0)}$ involves the steps of producing a discrete-time, continuous-amplitude signal $\underline{e}^{(0)}=\{e_i^{(0)}\}$, discrete low-pass filtering to produce an improved discrete-time, continuous-amplitude signal $\underline{e}^{(1)}=\{e_i^{(1)}\}$, and interpolating between the values $e_i^{(1)}$.

While, as compared with $\underline{e}^{(0)}$, $\underline{e}^{(1)}$ is a better approximation to $\underline{x}^{(0)}$, it has been realized, in accordance with an aspect of the invention, that $\underline{e}^{(1)}$ can be improved upon further. This may be seen from the example of FIG. 3 which illustrates simple analog-to-digital conversion, with oversampling of a signal by a factor of $R=f_s/2f_m=4$.

Figure 3:
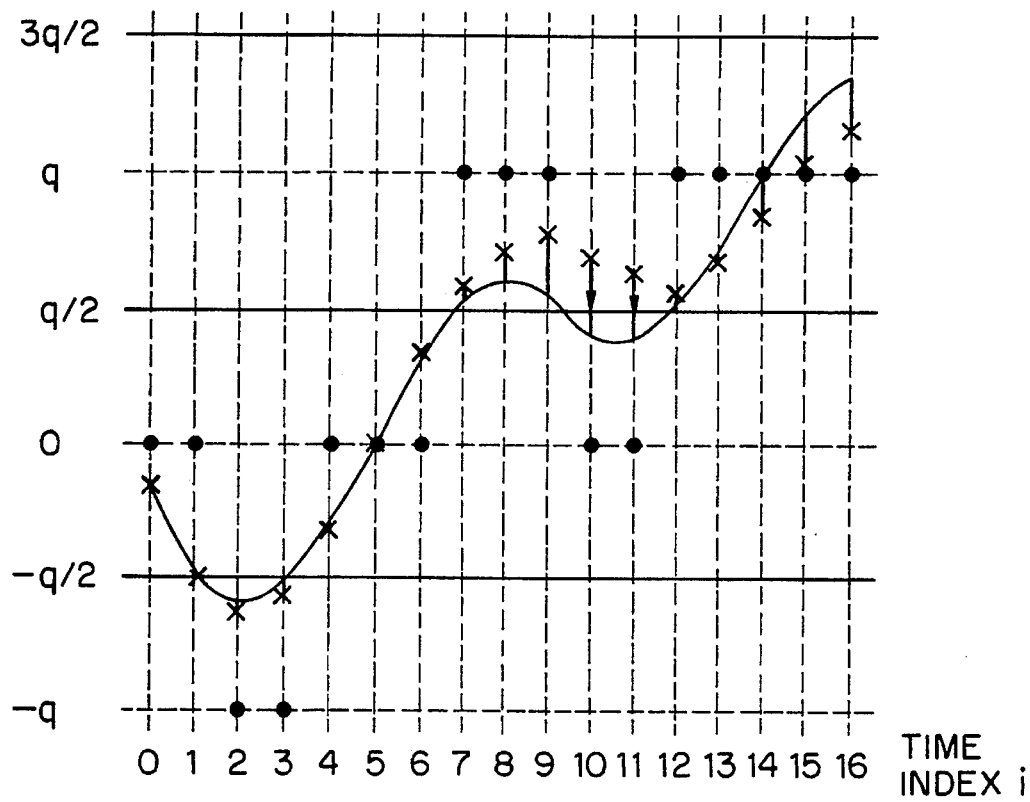
FIG. 3 is a graphic example of simple analog-to-digital conversion in accordance with a preferred embodiment of the invention.

FIG. 3 shows time indices 0 through 16, quantization levels $-q$, 0, and $q$, quantization thresholds $-q/2$, $q/2$, and $3q/2$, and a signal $x^{(0)}(t)$ represented as a continuous curve. The components $x_i^{(0)}$ of $\underline{x}^{(0)}$ are the ordinate values of $x^{(0)}(t)$ taken at the time indices 0 through 16. Shown further are estimates $e_i^{(0)}$, represented as circular spots, and improved estimates $e_i^{(1)}$, obtained by lowpass filtering of $\underline{e}^{(0)}$ and represented by x-marks. It is apparent from FIG. 3 that samples 10 and 11 of $\underline{e}^{(1)}$ are not in the same quantization intervals as the corresponding samples of $\underline{e}^{(0)}$, and that a better approximation is obtained by projecting them to the border of the right interval, i.e., by assigning a value $q/2$ to samples 10 and 11. In other words, a vector $\underline{e}^{(2)}$ whose components are the same as those of $\underline{e}^{(1)}$, with the exception of $e_{10}^{(2)}=e_{11}^{(2)}=q/2$ is a better approximation to $\underline{x}^{(0)}$.

Figure 5:
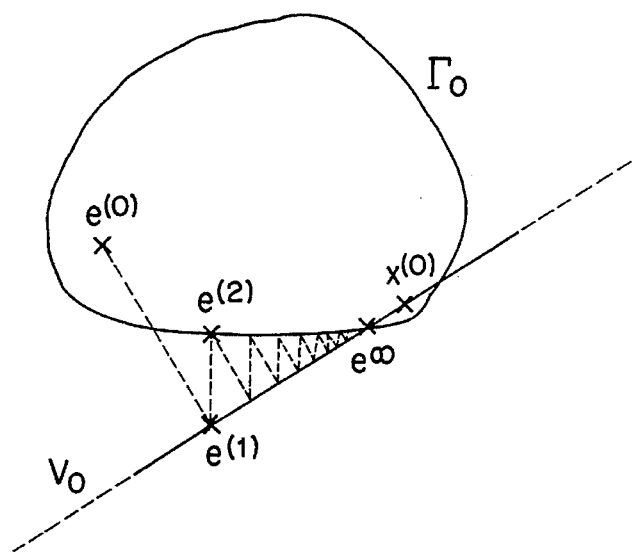
FIG. 5 is a geometric representation of alternate projections, illustrating an aspect of the invention.

The estimate $\underline{e}^{(2)}$ can be interpreted as a transformation of $\underline{e}^{(0)}$ by two consecutive operations: (i) a lowpass filtering, and (ii) a "code projection." Indeed, the procedure described above with reference to FIG. 2 and 3 may be geometrically interpreted in terms of two projections. In the space H of all discrete signals $\underline{x}$ sampled at rate $f_s$, if $V_0$ denotes the subspace of signals bandlimited by $f_m$, lowpass filtering of $\underline{e}^{(0)}$ to get $\underline{e}^{(1)}$ is an orthogonal projection on $V_0$. As can be seen in FIG. 5, this reduces the distance between the estimate and $\underline{x}^{(0)}$. The second transformation, from $\underline{e}^{(1)}$ to $\underline{e}^{(2)}$, is a projection also, but in a different direction, namely on the set $\Gamma_0$ of all those discrete signals which give the same code $\underline{C}^{(0)}$ when quantized. (For the example of FIG. 3, the set $\Gamma_0$ can be visualized as the domain between the hatched regions in FIG. 4.) If these alternate projections are repeated, a sequence of better and better approximations is obtained until, ideally and in the limit, a vector $\underline{e}^\infty$ in the intersection of $V_0$ and $\Gamma_0$ is reached.

The geometric interpretation given above for simple analog-to-digital conversion is based on notions of distance and orthogonality in a Hilbert space H, with a norm derived from an inner product. Moreover, for convergence there is reliance on convexity of $V_0$ and of $\Gamma_0$. As a subspace of H, $V_0$ is necessarily convex. The convexity of $\Gamma_0$ follows upon verification that, for all vectors $\underline{x}$ and $\underline{y}$ in $\Gamma_0$, and for all real numbers $\theta$ from 0 to 1, the vector $\theta\underline{x}+(1-\theta)\underline{y}$ is also in $\Gamma_0$. This is true because, for every time index i, when $x_i$ and $y_i$ belong to the quantization interval labeled $C_i^{(0)}$, this is also true for $\Gamma x_i+(1-\theta)y_i$.

It is known that alternate projections between intersecting convex sets converge; see D. C. Youla et al., "Image Restoration by the Method of Convex Projections: Part 1—Theory", *IEEE Transactions on Medical Imaging*, Vol. 1 (1982), pp. 81–94. Actually, convergence is assured if projection operators P on $V_0$ and Q on $\Gamma_0$ are weighted by a relaxation factor. Thus, the following operators including P and Q may be used:

$$S=P+(\alpha-1)(P-I) \text{ and } T=Q+(\beta-1)(Q-I),$$

where the relaxation coefficients α and β are chosen between 0 and 2. These operators may be interpreted as intermediate between the identity operator (α or β=0) and the symmetry operator with regard to the projection (α or β=2). When α=β=1, they coincide with P and Q, respectively. The choice of α and β affects the rate of convergence of the iteration, so that α and β may be (experimentally) chosen for rapid convergence. The iteration may be started with an arbitrary estimate (all 0's, for example.) More naturally, the given quantization $\underline{C}^{(0)}$ mat be used for this purpose.

Lowpass filtering may be effected by known methods, e.g., direct implementation or Fast Fourier Transform. Code projection amounts to solving a minimization problem, to at least approximately determine the nearest point in $\Gamma_0$.

It may be asked how much better an estimate $\underline{e}^\infty$ is, as compared with $\underline{e}^{(0)}$. In at least partial answer to this question it has been theoretically determined that, for simple analog-to-digital conversion, asymptotically the power of the quantization error is inversely proportional to $R^2$, provided $\underline{x}^{(0)}$ has enough quantization level crossings. This may be contrasted with a corresponding proportionality factor of R as mentioned above for the case of prior-art analog-to-digital conversion.

Other than to simple analog-to-digital conversion as described, preferred processing of the invention applies to dithered analog-to-digital conversion and also to single-path ΣΔ-conversion of arbitrary order. This may be appreciated with reference to the block diagram of FIG. 6 which equivalently describes $\Gamma_0$ for a family of conversion systems. There, F and $\underline{d}^{(0)}$ are, respectively, a linear operator (not necessarily time invariant) and a discrete signal, and are assumed to be completely known to the user. Simple analogto-digital conversion corresponds to the trivial case where $F=I$ (the identity operator) and $\underline{d}^{(0)}=0$. For dithered analog-to-digital conversion, $F=I$ and $\underline{d}^{(0)}$ is the dither sequence. The difference with the common use of a dither is that $\underline{d}^{(0)}$ is assumed to be completely known at every instant.

Figure 6:
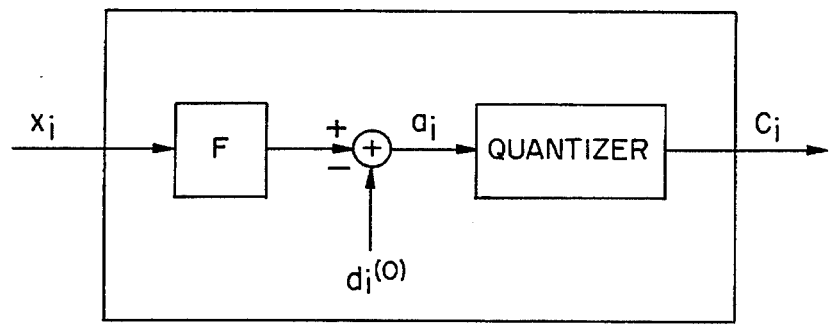
FIG. 6 is a block diagram of a preferred conversion system of the invention.
Figure 7:
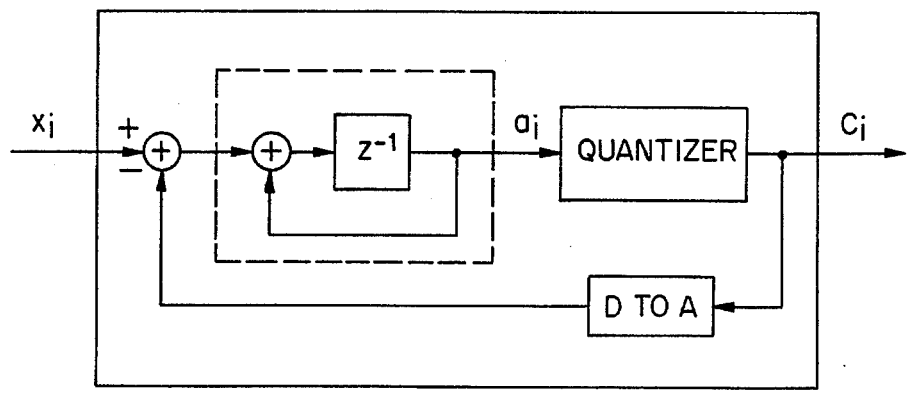
FIG. 7 is a block diagram of a first-order $\Sigma\Delta$-conversion system, relating to a preferred embodiment of the invention.
Figure 8:
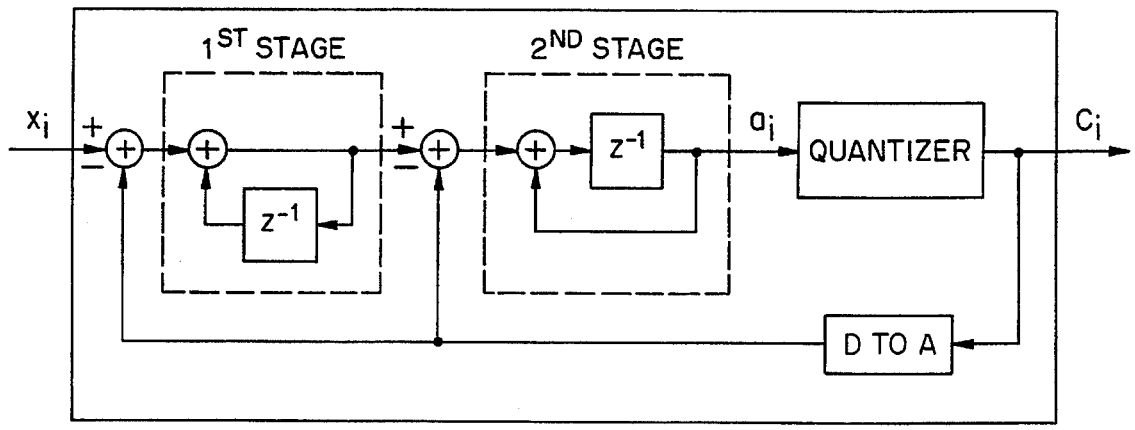
FIG. 8 is a block diagram of a second-order $\Sigma\Delta$-conversion system, relating to a preferred further embodiment of the invention.
Figure 9:
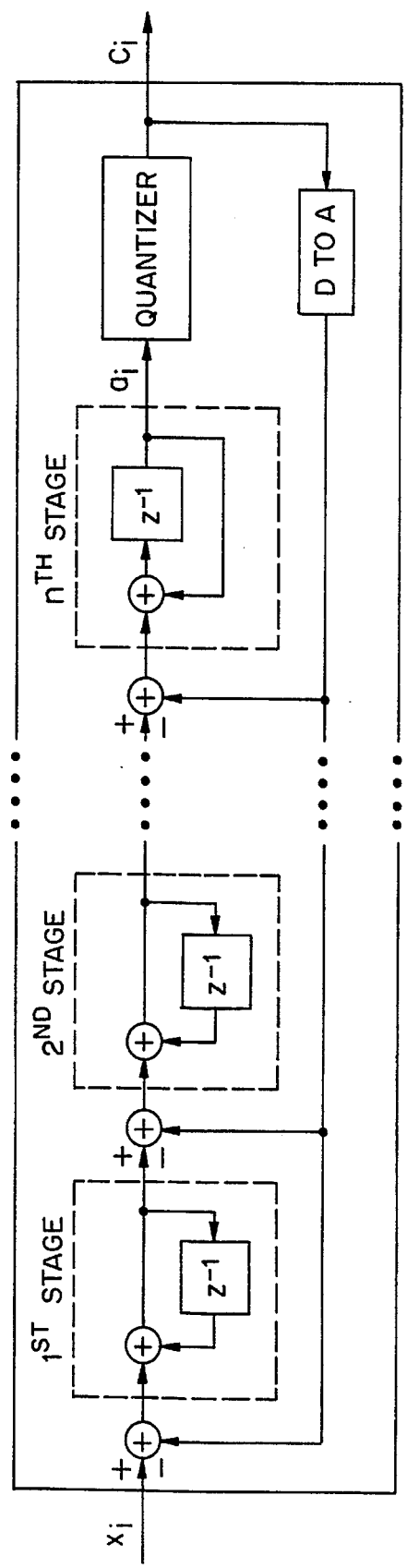
FIG. 9 is a block diagram of an n-th order $\Sigma\Delta$-conversion system, relating to a preferred further embodiment of the invention.

The family of conversion systems in which the set $\Gamma_0$ is convex further includes first-order, second-order and, indeed, n-th order single-path $\Sigma\Delta$-conversion, represented by respective block diagrams according to FIG. 7, 8, and 9. This can be seen, with reference to FIG. 9 and 10 as follows: If $\underline{C}^{(0)}$ is the code sequence given by $\underline{x}^{(0)}$, a signal $x(t)$ gives the code sequence $\underline{C}^{(0)}$ through the block diagram of FIG. 9 if and only if it also gives the code sequence $\underline{C}^{(0)}$ through the block diagram of FIG. 10. This last scheme is equivalent to the system of FIG. 6 where F is the cascade of n accumulators (and is therefore linear), and $\underline{d}^{(0)}$ is the value of $-\underline{a}$ in FIG. 10 when $x(t)$ is forced to zero. $\underline{d}^{(0)}$ is known, as it can be computed from $\underline{C}^{(0)}$.

For such a conversion system, convexity of $\Gamma_0$ can be demonstrated as follows: If $\underline{x}^{(1)}$ and $\underline{x}^{(2)}$ give the same code sequence $\underline{C}^{(0)}$, then at every time index i, $a_i^{(1)}$ and $a_i^{(2)}$ belong to the quantization interval labeled $C_i^{(0)}$. The signal at the quantizer input node corresponding to the input signal $\theta\underline{x}^{(0)}+(1-\theta)\underline{x}^{(2)}$ is equal to $$F(\theta\underline{x}^{(1)}+(1-\theta)\underline{x}^{(2)})-\underline{d}^{(0)}$$

which, using the facts that $1=\theta+(1-\theta)$ and that F is linear, can be transformed sequentially into $$\theta F(\underline{x}^{(1)})+(1-\theta)F(\underline{x}^{(2)})-\theta\underline{d}^{(0)}+(1-\theta)\underline{d}^{(0)},$$

$$\theta(F(\underline{x}^{(1)})-\underline{d}^{(0)})+(1-\theta)(F(\underline{x}^{(2)})-\underline{d}^{(0)}),$$

and $$\theta\underline{a}^{(1)}+(1-\theta)\underline{a}^{(2)}.$$

Thus, the i-th value of this signal also remains in the quantizer interval $C_i^{(0)}$, which implies that $\theta\underline{x}^{(1)}+(1-\theta)\underline{x}^{(2)}$ also gives the code sequence $\underline{C}^{(0)}$. This proves that $\Gamma_0$ is convex for the case of n-th order single-path $\Sigma\Delta$-conversion.

For dithered analog-to-digital conversion, code projection is similar, the difference lying in that, relative to the input signal, the quantization intervals move from one time to another. But each of these intervals is simply shifted by the value $d_i^{(0)}$ which is known by the user.

While, for simple and for dithered analog-to-digital conversion, code projection can be expressed as a transformation of the input samples individually, this is not the case for $\Sigma\Delta$-conversion. The following derivation applies to first-order $\Sigma\Delta$-conversion, with reference to FIG. 6 and 7. In FIG. 6, F is the accumulation function, and $\underline{d}^{(0)}$ is equal to the negative of the accumulation of $\underline{C}^{(0)}$.

Figure 10:
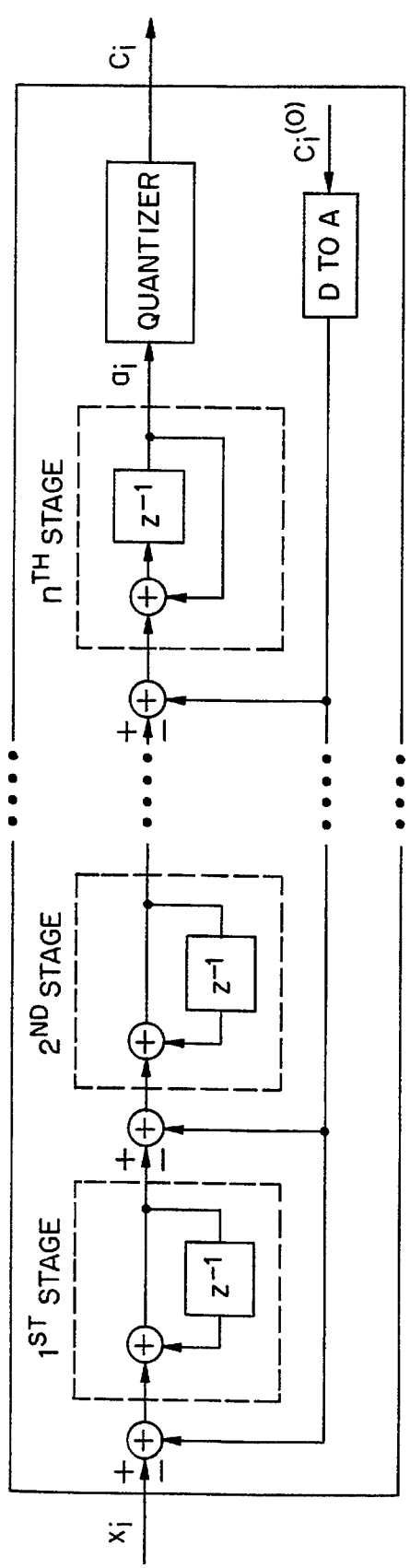
FIG. 10 is a diagram of a virtual coding system for n-th order $\Sigma\Delta$-conversion.
Figure 11:
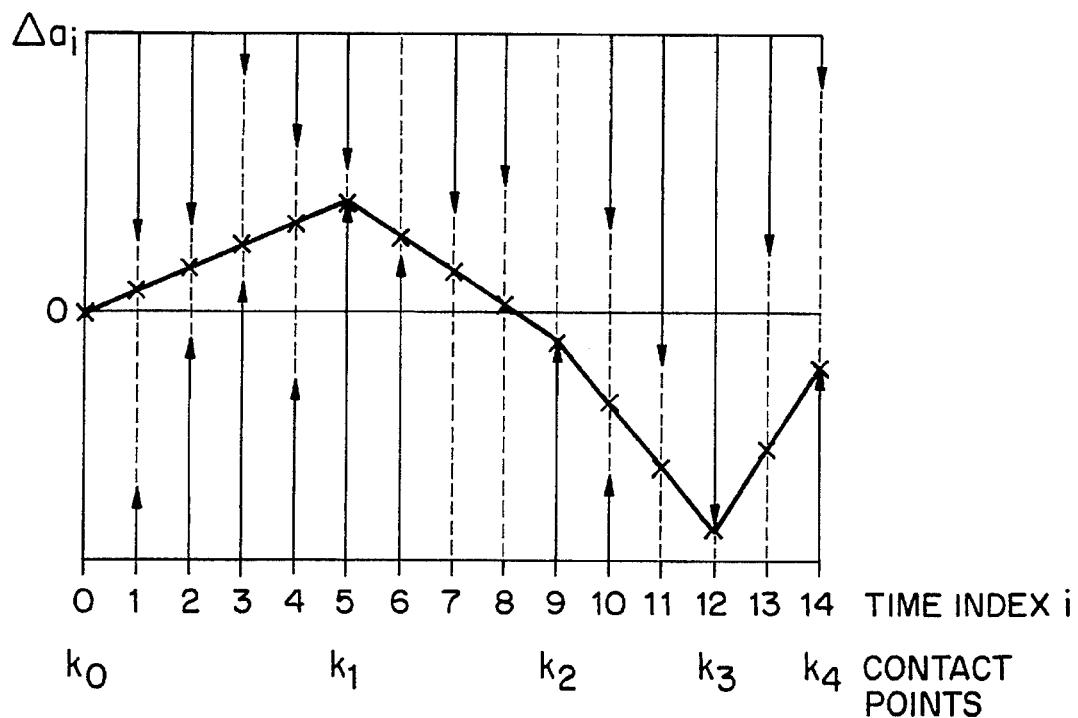
FIG. 11 is a graphic illustration of constrained minimization in a preferred first-order ΣΔ-conversion embodiment of the invention.

The projection of a signal on $\Gamma_0$ is the signal $\underline{x}+\Delta\underline{x}$ such that $\underline{x}+\Delta\underline{x}$ is in $\Gamma_0$ and the energy of $\Delta\underline{x}$ is minimized. If $\underline{a}=F(\underline{x})-\underline{d}^{(0)}$ is the signal at the input node of the quantizer, then the variation $\Delta\underline{x}$ on $\underline{x}$ will induce a variation $\Delta\underline{a}$ on $\underline{a}$ such that $\Delta\underline{a}=F(\Delta\underline{x})$. Saying that $\underline{x}+\Delta\underline{x}$ is in $\Gamma_0$ is equivalent to saying that, at every instant i, $a_i+\Delta a_i$ belongs to the quantization interval labeled $C_i^{(0)}$, or, $\Delta a_i$ belongs to this interval shifted by $-a_i$. In the following, such a shifted interval will be denoted by $Q_i$. Whenever a signal has to be projected on $\Gamma_0$, the interval sequence $Q_i$ can be computed. An example is shown in FIG. 10 where, at every time index i, the arrows symbolize the boundaries of $Q_i$. In this example, it is assumed that coding starts at time $i=0$, where $a_0$ is initialized to 0. ($\Delta a_0$ is then constrained to be equal to 0.) Included also is the general case of nonuniform quantization: every $Q_i$ can have different length, or may have only one boundary.

The projection problem then consists in finding the sequence $\Delta\underline{a}$ that minimizes the energy of $\Delta\underline{x}=F^{-1}(\Delta\underline{a})$ subject to the constraint that $\Delta a_i$ be in $Q_i$ for every i. It is noted that, as F is the integration operator, $F^{-1}$ is the first derivative operator. In accordance with an aspect of the invention it has been established that this solution can be found by what may be termed the "thread algorithm". Physically speaking, this amounts to attaching a thread at node (0, 0) in FIG. 11, and stretching the attached thread under tension between the arrows in the direction of increasing time indices. (The arrows are placed at boundaries of the quantization intervals $Q_i$.) Taking $\Delta a_i$ on the path of the resulting thread position gives the solution to the projection of $\underline{x}$ on $\Gamma_0$ (x-marks in FIG. 11.)

Figure 12:
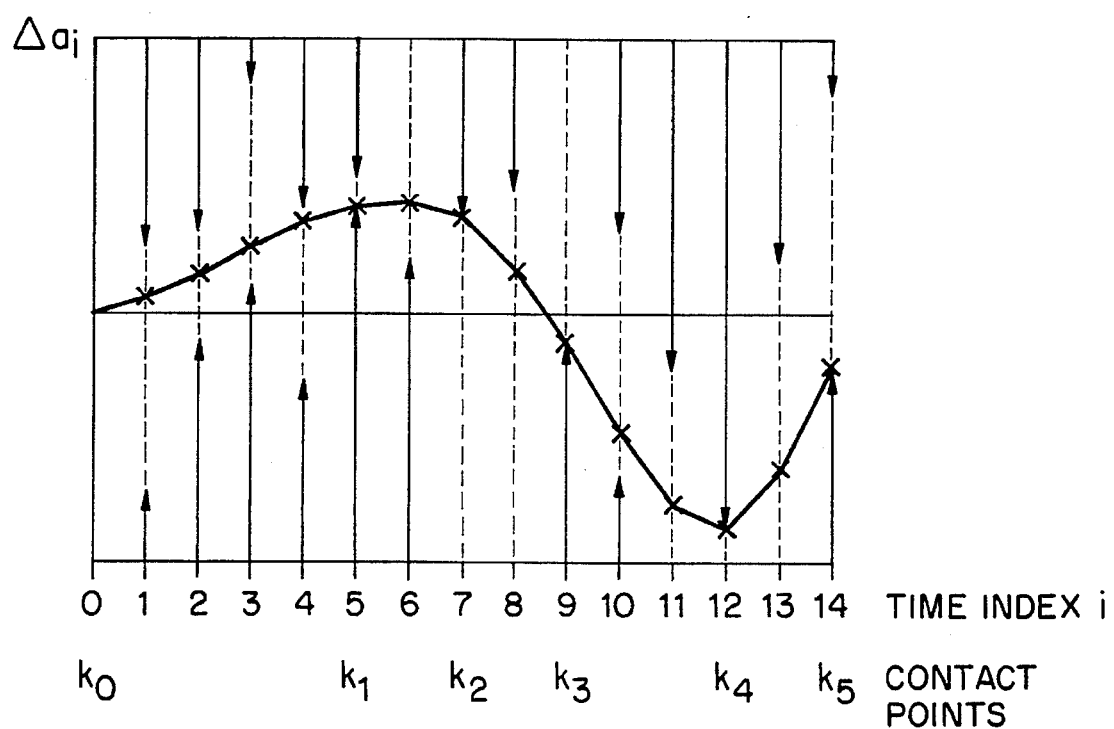
FIG. 12 is a graphic illustration of constrained minimization in a preferred second-order ΣΔ-conversion embodiment of the invention.

For second-order $\Sigma\Delta$-conversion the approach is similar, where this time F is the cascade of two accumulators. Consequently, $F^{-1}$ is the second derivative operator. In accordance with a further aspect of the invention, in this case the solution to the code projection problem can be visualized as illustrated in FIG. 12: an elastic blade is attached at node (0, 0) and passes between the arrows in the direction of increasing time. Taking $\Delta a_i$ on the path of the resulting position of the blade gives the solution to the projection of $\underline{x}$ on $\Gamma_0$ (x-marks in FIG. 12.)

Numerical tests were carried out to validate the principle of alternate projections; test results are summarized in Table 1. For the sake of ideal lowpass filtering, periodic signals were used. In each test, the error remaining in the estimate produced by the algorithm was measured and compared with the classical uniform noise power $q^2/12$ (with q denoting the quantizing interval.) The ratio between actual and classical noise power can be expressed in dB; if the mean-square error is proportional to $R^n$ (where R denotes the oversampling rate, and n is an integer), then every time R is doubled a gain of approximately $n\cdot3$ dB can be expected. For every test configuration, the number $2N+1$ of low-frequency (signal band) Fourier coefficients was fixed, as well as the peak-to-peak amplitude A, given in Table 1 in multiples of q. The algorithm was then applied to trial signals which were randomly generated, satisfying the conditions on the parameters N and A.

For simple analog-to-digital conversion (Tests 1 and 2), with signals having 4 quantization-threshold crossings, a gain of 5.7 dB was found upon doubling R. This is close to 6 dB=$2\cdot3$ dB, corresponding to an $R^2$ behavior. In these tests, the iteration was stopped as soon as the step increment of gain was less than 0.005 dB from one step to the next. Experiments were also carried out with different relaxation coefficients; the best results were obtained with $\alpha=\beta=2$. For example, with an oversampling rate $R=64=2^6$, classical signal reconstruction is expected to give a quantization noise reduction of $6\cdot3=18$ dB; with the present algorithm, however, the reduction is more than 26 dB (Test 3). Moreover, the iteration always terminated with an estimate in the interior of the intersection of $V_0$ and $\Gamma_0$ in a finite number of steps (64 on average in this case.)

A further test (Test 5) was performed with a nonideal filter, namely an FIR lowpass filter of length 2048 obtained by Hanning-windowing the perfect filter. The number of iterations was limited to 32. Only 0.1 dB was lost on average as compared with the ideal case (Test 4).

To test conversion with dither, a sinusoidal dither was used having amplitude q and frequency $2f_m$ (Tests 6 and 7.) Even better error reduction, namely 30.4 dB was obtained, and the $R^2$ dependency was confirmed, as a gain of 11.5 dB≈4·3 dB was realized upon replacing 4R instead of R (Tests 8 and 9).

For first-order ΣΔ-conversion a single-threshold comparator was used as quantizer, giving code +1 for positive and code −1 for negative input. Correspondingly, the built-in digital-to-analog converter produces the analog value +q or −q. The relaxation coefficients were fixed at $\alpha=\beta=1$. $\underline{e}^{(0)}=\underline{0}$ was used the first estimate of the iteration. With the usual $R^3$ behavior, a gain of $3 \cdot 3 \cdot 3 = 27$ dB would be expected when R is multiplied by $8=2^3$. In the tests, the improvement was approximately 34.4 dB which is close to 36 dB=4·3·3 dB, corresponding to an $R^4$ behavior. The average number of iterations was 21 for R=64, and 26 for R=128.

Similar tests were performed for second-order ΣΔ-conversion (Tests 10 and 11). While normal $R^5$ behavior would give a gain of $5 \cdot 3 \cdot 3 = 45$ dB, a gain of approximately 53.0 dB was realized. This is close to 54 dB=6·3·3 dB which corresponds to an $R^6$ behavior.

While, ideally, calculations called for in accordance with preferred methods are carried out without round-off, in practice they will have to be carried out in finite-precision arithmetic. In the tests described above, 32-bit floating-point arithmetic was used. (The number of bits required for the calculations is certainly greater than the number of bits in the input data; in general, adequate computational precision may be arrived at experimentally.)

The final improved codes may be represented as computed, i.e., with the same number of digits as used in the noise-reduction calculations. This is indicated especially when further computations will follow, e.g., for mixing with another signal. Alternatively, in the interest of storage space conservation, for example, a final representation may have fewer digits (but preferably include guard digits beyond the digits gained by noise reduction.)

It is noted further that methods described above do not depend on uniformity of quantization intervals. Accordingly, such methods are applicable, e.g., when the quantization intervals are purposely nonuniform (e.g., in the quantization of speech, using a logarithmic spacing of quantization thresholds), or when quantization thresholds are inaccurate due to technological limitations. Furthermore, quantization intervals may vary as quantizer values may depend on physical conditions (e.g., quantizer values depending on temperature.) What is required for preferred noise reduction, however, is that the quantization intervals be known. This information may be known as a characteristic of the converter; alternatively, when quantization thresholds vary with time, such information may have to be acquired repeatedly in the course of a quantization process, thereby permitting (repeated) self-calibration of the noise-reduction procedure.

While the tests described above were carried out with programs on a general-purpose computer, the use of application-specific hardware is not precluded. For example, if the number of noise-reduction steps is known in advance, such an implementation may take the form of a cascade of stages implementing the described transformations. The values of the parameters $\alpha$ and $\beta$ may differ from stage to stage.

Among contemplated fields of application of preferred noise-reduction methods and systems are the production and reproduction of sound recordings, of seismic records, of imaging data (e.g., as produced in medical imaging), and of scientific data representing measurements, e.g., obtained by satellite-based or otherwise remote sensors.

TABLE 1

| Test Number | A/D Conversion Technique | 2N + 1 | A (q) | R | α/β | Average Number of Iterations | MSE Reduction Average (dB) | MSE Reduction Standard Dev. (dB) |
|---|---|---|---|---|---|---|---|---|
| 1 | simple | 3 | 2 | 64 | 1/1 | 27 | 27.7 | } Δ = 5.7  } Δ = 4.3 |
| 2 |  |  |  | 128 |  | 32 | 33.4 |  |
| 3 | simple | 7 | 4 | 64 | 2/2 | 64 | 26.3 | 6.7 |
| 4 |  |  |  | 56 |  |  | 8.4 | } Δ = 0.1  } Δ = 0.1 |
| 5 | simple | 127 | 4 | 16 | 2/2 | 32 | 8.3 |  |
| 6 | dithered | 7 | 0 to 4 | 64 | 2.2 | 54 | 30.4 | } Δ = 11.5  } Δ = 4.9 |
| 7 |  |  |  | 256 |  | 173 | 41.9 |  |
| 8 | 1st order ΣΔ | 3 | 1 | 16 | 1/1 | 21 | 28.5 | } Δ = 34.5  } Δ = 5.3 |
| 9 |  |  |  | 128 |  | 26 | 63.0 |  |
| 10 | 2nd order ΣΔ | 3 | 1 | 16 | 1/1 | 23 | 37.8 | } Δ = 53.0  } Δ = 6.0 |
| 11 |  |  |  | 128 |  | 36 | 90.8 |  |

We claim:

1. A method for producing, from a discrete-time, oversampled and quantized version of an essentially continuous-valued signal, a reduced-noise estimate of the essentially continuous-valued signal; the discrete-time, oversampled and quantized version of the essentially continuous-valued signal belonging to a convex set which consists of all discrete-time signals whose quantized representation is equal to the discrete-time, oversampled and quantized version of the essentially continuous-valued signal; the method comprising:

a first step including lowpass filtering of an initial estimate of the essentially continuous-valued signal, to produce a lowpass-filtered signal; and a second step including projection of the lowpass-filtered signal onto said set, to produce an improved estimate of the essentially continuous-valued signal, with reduced noise as compared with the initial estimate of the essentially continuous-valued signal.

2. The method of claim 1, wherein the first and second steps are repeated iteratively, with successive improved estimates from the second step used as initial estimates in the first step.

3. The method of claim 2, terminated when successive improved estimates of the essentially continuous-valued signal differ from each other by less than a predetermined amount.

4. The method of claim 2, terminated after a predetermined number of iteratively repeated steps.

5. The method of claim 1, wherein the second step comprises:
at least approximately determining the one discrete-time signal of said set which is closest to the lowpass-filtered signal.

6. The method of claim 5 in simple analog-to-digital conversion, wherein the second step comprises, in a case in which a value of a lowpass-filtered signal does not lie in the same quantization interval as the corresponding value of the discrete-time, oversampled and quantized version of the essentially continuous-valued signal:
assigning, as a value of the improved estimate of the essentially continuous-valued signal, the one quantization-threshold value nearest to the corresponding value of the discrete-time, oversampled and quantized version of the essentially continuous-valued signal.

7. The method of claim 5 in dithered analog-to-digital conversion, wherein the second step comprises, in a case in which a value of the lowpass-filtered signal does not lie in the same quantization interval as the corresponding value of the discrete-time, oversampled and quantized version of the essentially continuous-valued signal:
assigning, as a value of the improved estimate of the essentially continuous-valued signal, the one dither-shifted quantization-threshold value nearest to the corresponding value of the discrete-time, oversampled and quantized version of the essentially continuous-valued signal.

8. The method of claim 5 in first-order single-path $\Sigma\Delta$-conversion, wherein the second step comprises:
producing, as the improved estimate of the essentially continuous-valued signal, a signal whose time-accumulation lies on a thread under tension, fastened at the origin of a coordinate system in which amplitude values are plotted against time, and passing through shifted quantization intervals.

9. The method of claim 5 in second-order single-path $\Sigma\Delta$-conversion, wherein the second step comprises:
producing, as the improved estimate of the essentially continuous-valued signal, a signal whose second-order time accumulation lies on an elastic blade, fastened at the origin of a coordinate system in which amplitude values are plotted against time, and passing through shifted quantization intervals.

10. The method of claim 1, effected at least in part by digital computation.

11. The method of claim 1, wherein the reduced-noise final estimate of the essentially continuous-valued signal is digitally approximated.

12. The method of claim 1, wherein the discrete-time, oversampled and quantized version of the essentially continuous-valued signal is used as the initial estimate of the essentially continuous-valued signal.

13. The method of claim 1, further comprising a step of calibration of quantization intervals.

14. The method of claim 1, wherein lowpass filtering is weighted by a relaxation factor.

15. The method of claim 1, wherein projection is weighted by a relaxation factor.

16. The method of claim 1, wherein the first step comprises transforming the initial estimate of the essentially continuous-valued signal by a transformation $$S=P+(\alpha-1)(P-I),$$

wherein
P denotes lowpass filtering, I the identity operator, and $\alpha$ a first number in the interval from 0 to 2, and
the second step comprises transforming the lowpass-filtered signal by a transformation $$T=Q+(\beta-1)(Q-I),$$

wherein
Q denotes projection onto said set, I the identity operator, and $\beta$ a second number in the interval from 0 to 2.

17. The method of claim 16, wherein the values of $\alpha$ and $\beta$ are chosen to at least approximately minimize the number of steps taken for achieving desired noise reduction.

18. The method of claim 1, wherein the essentially continuous-valued signal is derived from sound.

19. The method of claim 1, wherein the essentially continuous-valued signal is derived from seismic waves.

20. The method of claim 1, wherein the essentially continuous-valued signal is derived from an image.

21. A system for producing, from a discrete-time, oversampled and quantized version of an essentially continuous-valued signal, a reduced-noise estimate of the essentially continuous-valued signal; the discrete-time, oversampled and quantized version of the essentially continuous-valued signal belonging to a convex set which consists of all discrete-time signals whose quantized representation is equal to the discrete-time, oversampled and quantized version of the essentially continuous-valued signal; the system comprising
first computing means for lowpass filtering of an initial estimate of the essentially continuous-valued signal, to produce a lowpass-filtered signal; and
second computing means for projection of the lowpass-filtered signal onto said set, to produce an improved estimate of the essentially continuous-valued signal, with reduced noise as compared with the initial estimate of the essentially continuous-valued signal.

22. The system of claim 21, comprising a cascade of first and second computing means.

23. A method for making a recording, comprising producing, from a discrete-time, oversampled and quantized version of an essentially continuous-valued signal, a reduced-noise estimate of the essentially continuous-valued signal; the discrete-time, oversampled and quantized version of the essentially continuous-valued signal belonging to a convex set which consists of all discrete-time signals whose quantized representation is equal to the discrete-time, oversampled and quantized version of the essentially continuous-valued signal; the method comprising
a first step including lowpass filtering of an initial estimate of the essentially continuous-valued signal, to produce a lowpass-filtered signal; and
a second step including projection of the lowpass-filtered signal onto said set, to produce an improved estimate of the essentially continuous-valued signal, with reduced noise as compared with the initial estimate of the essentially continuous-valued signal.

24. A method for reproducing an analog signal, comprising producing, from a discrete-time, oversampled and quantized version of the analog signal, a reduced-noise estimate of the analog signal; the discrete-time, oversampled and quantized version of the analog signal belonging to a convex set which consists of all discrete-time signals whose quantized representation is equal to the discrete-time, oversampled and quantized version of the analog signal; the method comprising a first step including lowpass filtering of an initial estimate of the analog signal, to produce a lowpass-filtered signal; and a second step including projection of the lowpass-filtered signal onto said set, to produce an improved estimate of the analog signal, with reduced noise as compared with the initial estimate of the analog signal.

* * * * *

UNITED STATES PATENT AND TRADEMARK OFFICE
CERTIFICATE OF CORRECTION

PATENT NO. : 5,493,297
DATED : February 20, 1996
INVENTOR(S) : Nguyen et al.

It is certified that error appears in the above-indentified patent and that said Letters Patent is hereby corrected as shown below:

Column 1, line 9 insert:

--The United States Government has certain rights in this invention under Contract CDR-881111 awarded by the National Science Foundation.--
Col 4, line 24, replace "$\Gamma x_i$" with --$\theta x_i$--

Signed and Sealed this

Eighteenth Day of June, 1996

BRUCE LEHMAN

Commissioner of Patents and Trademarks